United States Patent
Anderson et al.

(10) Patent No.: US 8,927,411 B2
(45) Date of Patent: Jan. 6, 2015

(54) SYSTEM AND METHOD FOR FORMING AN ALUMINUM FUSE FOR COMPATIBILITY WITH COPPER BEOL INTERCONNECT SCHEME

(71) Applicant: International Business Machines Corporation, Armonk, NY (US)

(72) Inventors: Felix P. Anderson, Colchester, VT (US); Timothy H. Daubenspeck, Colchester, VT (US); Jeffrey P. Gambino, Westford, VT (US); Timothy S. Hayes, Colchester, VT (US); Donald R. Letourneau, Winooski, VT (US); Thomas L. McDevitt, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/141,559

(22) Filed: Dec. 27, 2013

(65) Prior Publication Data
US 2014/0106559 A1    Apr. 17, 2014

Related U.S. Application Data

(62) Division of application No. 13/488,870, filed on Jun. 5, 2012.

(51) Int. Cl.
*H01L 21/768* (2006.01)
*H01L 23/525* (2006.01)

(52) U.S. Cl.
CPC ...... *H01L 21/76892* (2013.01); *H01L 23/5256* (2013.01); *H01L 21/76838* (2013.01)
USPC .......................................... 438/601; 257/529

(58) Field of Classification Search
CPC ............ H01L 2924/00; H01L 23/5256; H01L 2924/00014; H01L 2224/48227; H01L 2224/73265
USPC .......................................... 257/529; 438/601
See application file for complete search history.

(56) References Cited

U.S. PATENT DOCUMENTS

| | | |
|---|---|---|
| 6,737,345 B1 | 5/2004 | Lin et al. |
| 6,750,129 B2 | 6/2004 | Yang et al. |
| 6,864,124 B2 | 3/2005 | Lee et al. |
| 6,960,835 B2 | 11/2005 | Barth et al. |
| 7,067,897 B2 | 6/2006 | Hatano et al. |
| 7,535,078 B2 | 5/2009 | Kobayashi et al. |
| 7,666,734 B2 | 2/2010 | Okada |
| 2003/0071323 A1 | 4/2003 | Chou et al. |
| 2005/0205965 A1 | 9/2005 | Yang |
| 2009/0267180 A1 | 10/2009 | Kim |

OTHER PUBLICATIONS

U.S. Appl. No. 13/488,870, Office Action Communication dated Apr. 10, 2014, 9 pages.

(Continued)

*Primary Examiner* — Tony Tran
(74) *Attorney, Agent, or Firm* — Gibb & Riley, LLC

(57) ABSTRACT

A semiconductor fuse device and a method of fabricating the fuse device including a last metal interconnect layer including at least two discrete metal conductors, an inter-level dielectric layer deposited over the last metal interconnect layer and the at least two discrete metal conductors, a thin wire aluminum fuse connecting the at least two discrete metal conductors, and a fuse opening above the aluminum fuse.

5 Claims, 6 Drawing Sheets

(56) References Cited

OTHER PUBLICATIONS

Office Action Communication, U.S. Appl. No. 13/488,870 Dated Aug. 5, 2013, pp. 1-8.

Office Action Communication, U.S. Appl. No. 13/488,870 Dated Oct. 16, 2013, pp. 1-11.

U.S. Appl. No. 13/488,870, Advisory Action dated Jun. 24, 2014, 5 pages.

Appendix P, "List of IBM Patents or Patent Applications Treated as Related", Jun. 27, 2014, 1 page.

U.S. Appl. No. 13/488,870, Notice of Allowance dated Aug. 21, 2014, 9 pages.

US 8,927,411 B2

SYSTEM AND METHOD FOR FORMING AN ALUMINUM FUSE FOR COMPATIBILITY WITH COPPER BEOL INTERCONNECT SCHEME

CROSS-REFERENCE TO RELATED APPLICATIONS

This application is a divisional of U.S. patent application Ser. No. 13/488,870 filed Jun. 5, 2012, the complete disclosure of which is incorporated herein by reference.

BACKGROUND

1. Field of the Invention

The embodiments presented herein generally relate to the design and fabrication of a semiconductor fuse that is compatible with copper metal Back-End-Of-Line (BEOL) processing for use in a radiation hardened Static Random-Access Memory (SRAM). More particularly, the embodiments incorporate an aluminum fuse into the environment of a metal (e.g., copper) interconnect level.

2. Description of Related Art

For radiation hardened semiconductor fabrication applications, e-fuses and copper fuses are incompatible with application conditions. A radiation hardened circuit cannot reliably un-bias a copper fuse as it may normally be un-biased for other copper BEOL processes. Additionally, e-fuse technology is also incompatible with radiation hardened architecture.

Due to an inability to un-bias a copper fuse, and concern for copper filament formation in a radiation hardened design environment, an alternative material, structure and method of fabrication is necessary to overcome these limitations in the radiation hardened SRAM environment.

An alternative aluminum composition fuse is presented herein that overcomes these limitations.

SUMMARY OF THE INVENTION

According to one example, a semiconductor fuse device includes a metal interconnect layer including at least two discrete metal conductors, where an inter-level dielectric layer is deposited over the metal interconnect layer and the at least two discrete metal conductors. A conductive fuse connects the at least two discrete metal conductors, and a fuse opening above the conductive fuse is positioned between the at least two discrete metal conductors.

According to another example, a semiconductor fuse device includes an uppermost metal interconnect layer including a plurality of metal conductors, where an inter-level dielectric layer is deposited over the uppermost metal interconnect layer and at least two discrete metal conductors. A conductive fuse connects at least two discrete metal conductors in the uppermost metal interconnect layer by a central linear fuse portion, and a fuse opening is positioned above the central linear fuse portion.

According to another example, a method of fabricating a semiconductor fuse includes forming a metal interconnect layer including at least two discrete metal conductors, where an inter-level dielectric layer is provided above the metal interconnect layer and the at least two discrete metal conductors. A conductive fuse is deposited into a portion of the inter-level dielectric layer and is electrically connected between the at least two discrete metal conductors. A portion of the inter-level dielectric layer is removed above the conductive fuse to create a fuse opening.

According to another example, a method of fabricating a semiconductor fuse includes forming an uppermost metal interconnect layer including a plurality of metal conductors, and forming an inter-level dielectric layer above the uppermost metal interconnect layer and at least two discrete metal conductors. A conductive fuse is deposited into a portion of the inter-level dielectric layer and is electrically connected to the at least two discrete metal conductors with a central linear fuse portion. A portion of the inter-level dielectric layer is removed above the central linear fuse portion to create a fuse opening.

BRIEF DESCRIPTION OF THE SEVERAL VIEWS OF THE DRAWINGS

The foregoing and other exemplary purposes, aspects and advantages will be better understood from the following detailed description of an exemplary embodiment herein with reference to the drawings, in which.

DETAILED DESCRIPTION

Figure 1:
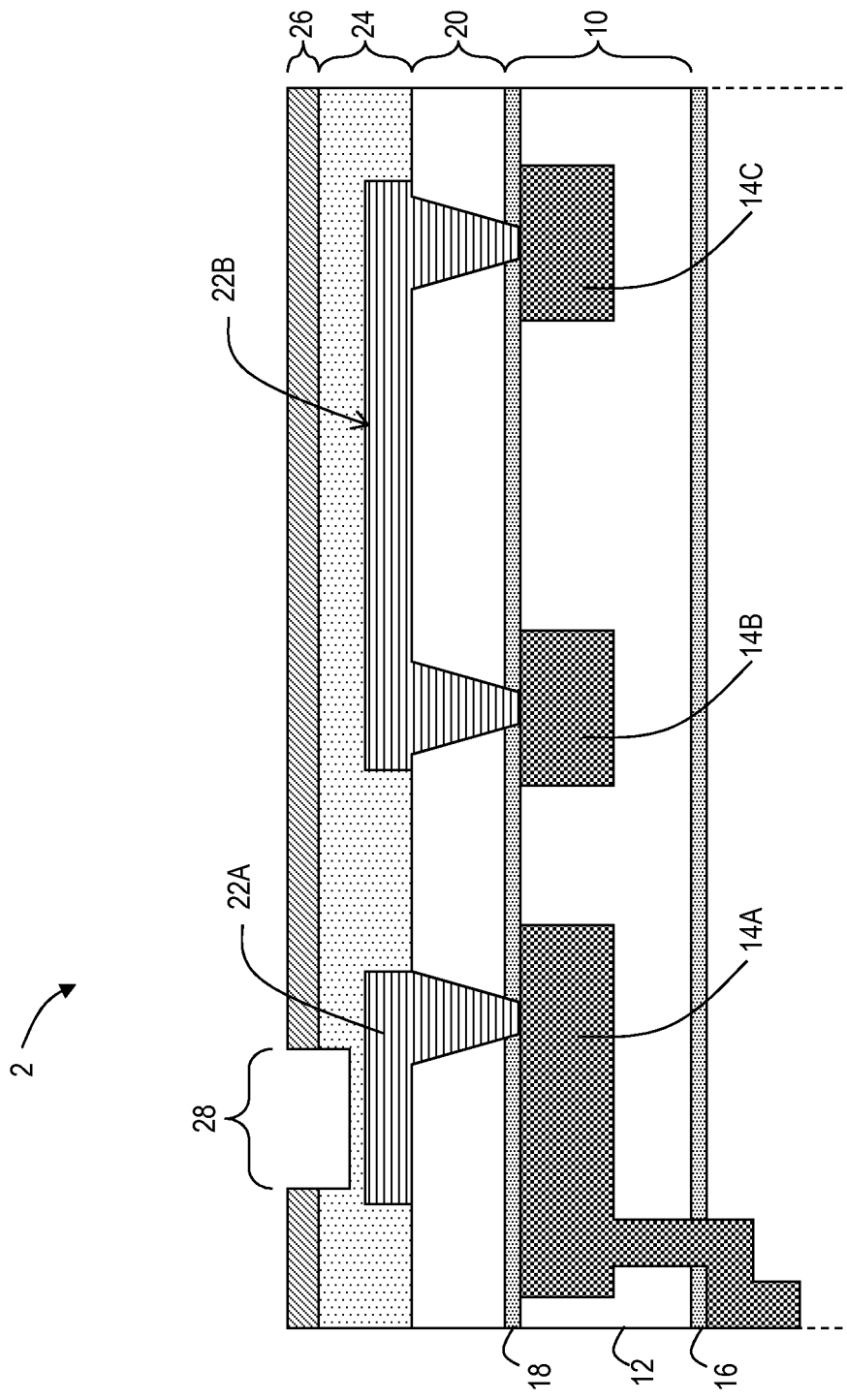
FIG. 1 is a schematic diagram of a sectional view of fabricating a fuse in a semiconductor.
Figure 2:
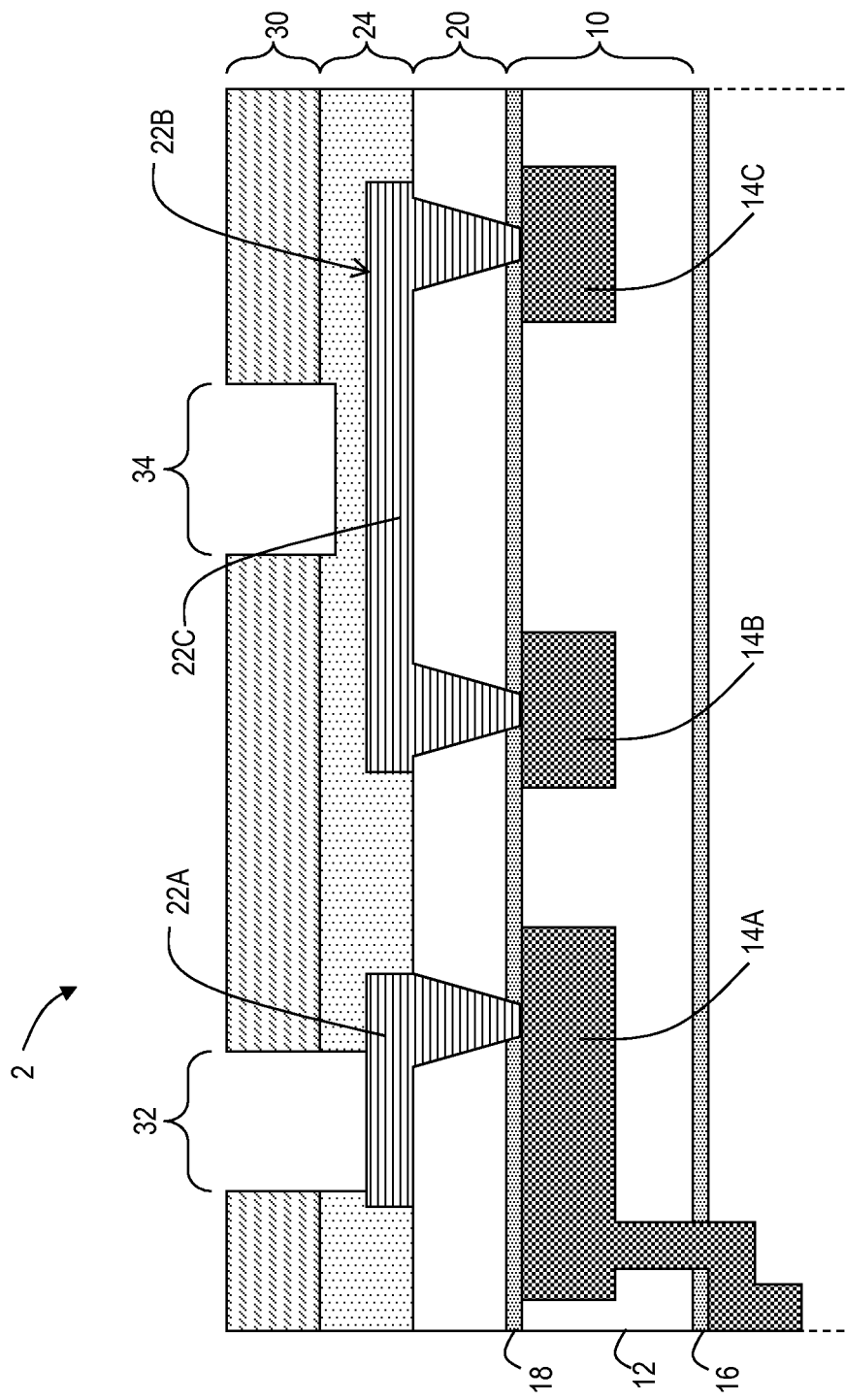
FIG. 2 is a schematic diagram of another sectional view of fabricating a fuse in a semiconductor according to FIG. 1.

Referring now to the drawings, and more particularly to FIGS. 1 and 2, there are shown exemplary illustrations of the method and structures of a fuse embedded in a semiconductor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

FIG. 1 illustrates a schematic diagram of a sectional view of fabricating a fuse in a semiconductor 2.

An uppermost or last metal interconnect layer 10 of a semiconductor device 2 includes a dielectric layer 12 that includes metal interconnection structures, such as conductors 14A, 14B and 14C, which may comprise copper. The last metal interconnect layer is bounded by a lower cap layer 16 and an upper cap layer 18. The upper cap lay 18 may be a copper diffusion barrier. A final insulator layer 20 is deposited on top of the upper cap layer 18 of the last metal interconnect layer 10. A mask is applied (not shown) to the final insulator layer 20 to remove material in the final insulator layer 20 such that conductive portions, in particular, conductive pad 22A and fuse, indicated generally as 22B are deposited through the final insulator layer 20 to contact an upper portion of the metal conductors 14A, 14B and 14C, respectively in the last metal interconnect layer 10.

For purposes herein, an "insulator" is a relative term that means a material or structure that allows substantially less (<95%) electrical current to flow than does a "conductor." The dielectrics (insulators) mentioned herein can, for example, be formed by plasma deposition of SiO2 or SiO2 based materials by reacting either tetra-ethyl-ortho-silane (TEOS) or silane with O2 or activated O2, i.e. O3 or O⁻. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, aluminum, or copper, or a metal silicide, any alloys of such metals, and may be deposited using physical vapor deposition, chemical vapor deposition, or any other technique known in the art.

An oxide layer 24 covers the conductive pad 22A and fuse 22B and the remaining exposed portions of the final insulator layer 20. FIG. 1 illustrates a mask 26 patterned and applied to the top surface of the oxide layer 24 where an initial pad channel opening 28 is formed in the oxide layer 24 using a material removal process.

A hardmask can be formed of any suitable material, whether now known or developed in the future, such as a metal or organic or inorganic (Si3N4, SiC, SiO2C (diamond)) hardmask, that has etch resistance greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

FIG. 2 shows a schematic diagram illustrating another sectional view of fabricating a fuse in a semiconductor where the mask 26 of FIG. 1 is removed and an imageable polyimide 30 is used to define openings over both the conductive pad 22A and the fuse 22B. A pad opening 32 is created over a portion of the conductive pad 22A using a through via process (RIE) to reduce over-etching over the conductive pad 22A. A portion of the conductive pad 22A is completely exposed through the pad opening 32. Additionally, a fuse opening 34 is created in the polyimide layer 30 via a material removal process (RIE) using a selective masking process. When the fuse opening 34 is created, a thin passivation layer remains over the linear fuse portion 22C.

In the device shown in FIGS. 1 and 2, the fuse 22B may be constructed of a variety of materials, including tungsten, hafnium, tantalum, molybdenum, titanium, nickel, aluminum, or copper, as is known in the art. Typically, the linear fuse portion 22C is a few millimeters thick. However, in a radiation hardened application, it is desirable for the fuse to be much thinner; for example, having a thickness less than 4 microns to as thin as less than 1 micron.

Figure 3:
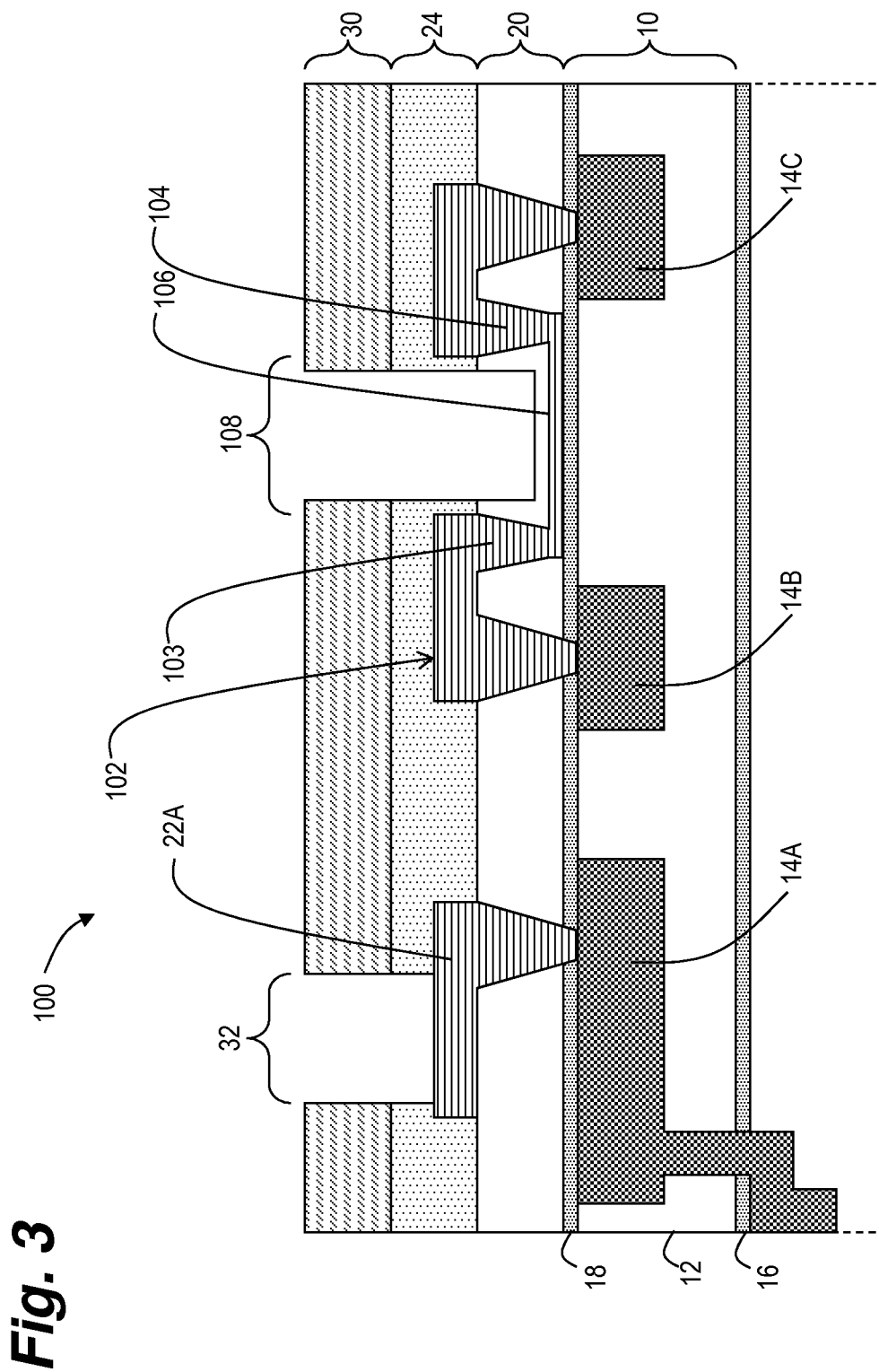
FIG. 3 is a schematic diagram of a first embodiment illustrating a sectional view of an aluminum fuse in a semiconductor.
Figure 4:
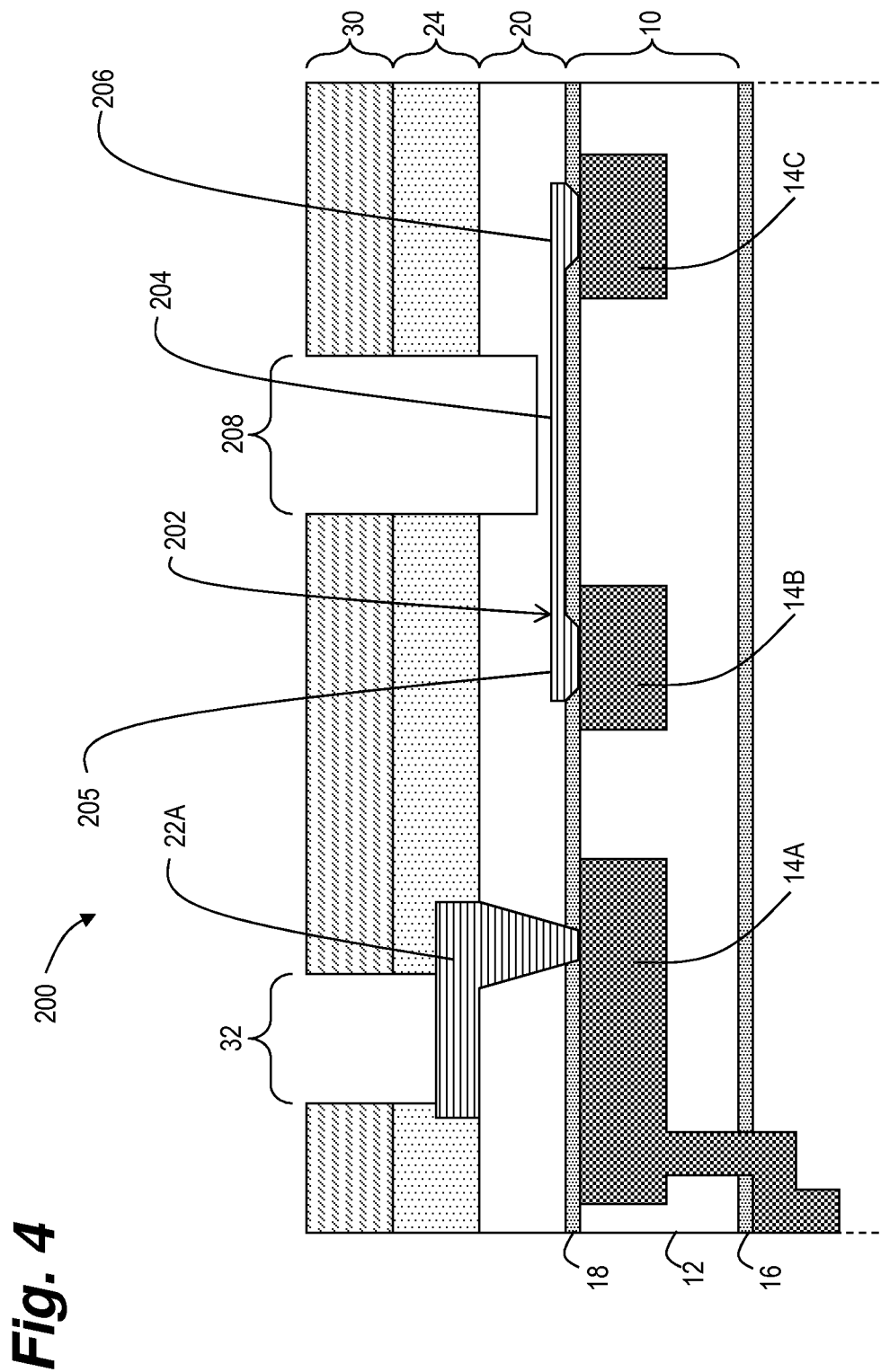
FIG. 4 is a schematic diagram of a second embodiment illustrating a sectional view of another aluminum fuse in a semiconductor.

FIG. 3 illustrates a schematic diagram of a first embodiment, constructed in a manner similar to the process shown in FIGS. 1 and 2. FIG. 3 shows a sectional view of an aluminum fuse, indicated generally as 102, in a semiconductor 100 where the aluminum fuse 102 has a pair of vertical via portions 103 and 104 that extend from the metal conductors 14B and 14C through the upper cap layer 18 and final insulator layer 20 into the oxide layer 24. A linear fuse portion 106 extends between the metal conductors 14B and 14C and is located completely within the final insulator layer 20, contacting the lowest portion of the final insulator layer 20 and proximate the upper surface of the last metal interconnect layer 10 on the top of the cap layer 18. Thus, in this embodiment, when viewed in cross-section as shown in FIG. 4, the fuse structure includes a linear fuse portion 106 connected between two inverted U-shaped vertical via portions 103, 104 that contact the metal conductors 14B, 14C. The U-shaped vertical via portions 103, 104 pass through the insulator 20 and into the oxide layer 24 before contacting the linear fuse portion 106 from above the fuse portion 106. The vertical via portions 103 and 104 may be a few millimeters thick such as fuse 22B as shown in FIGS. 1 and 2; however, the linear fuse portion 106 is much thinner; for example, having a thickness less than 4 microns to as thin as less than 0.25 microns.

In this embodiment, a fuse opening 108 extends through the polyamide layer 30, the oxide layer 24, and into the final insulator layer 20 stopping just above the upper surface of the linear fuse portion 106 such that there is a small amount of final insulator layer 20 between the linear fuse portion 106 and the fuse opening 108.

FIG. 4 illustrates a schematic diagram of a second embodiment, constructed in a manner similar to FIGS. 1 and 2. FIG. 4 shows a sectional view of another aluminum fuse, indicated generally as 202, in a semiconductor 200 where the aluminum fuse 202 extends from the top surface of the metal conductors 14B and 14C only into the final insulator layer 20 such that the linear fuse portion 204 contacts the lowest portion of the final insulator layer 20 and is proximate the upper surface of the last metal interconnect layer 10 on the top of the cap layer 18. The end portions 205 and 206 that contact the metal conductors 14B and 14C may be a few millimeters thick such as fuse 22B as shown in FIGS. 1 and 2; however, the linear fuse portion 204 is much thinner; for example, having a thickness less than 4 microns to as thin as less than 0.25 microns.

In this second embodiment, a fuse opening 208 extends through the polyamide layer 30, the oxide layer 24, and into the final insulator layer 20 stopping just above the upper surface of the fuse 202 such that there is a small amount of final insulator layer 20 between the linear fuse portion 204 and the fuse opening 208.

Figure 5:
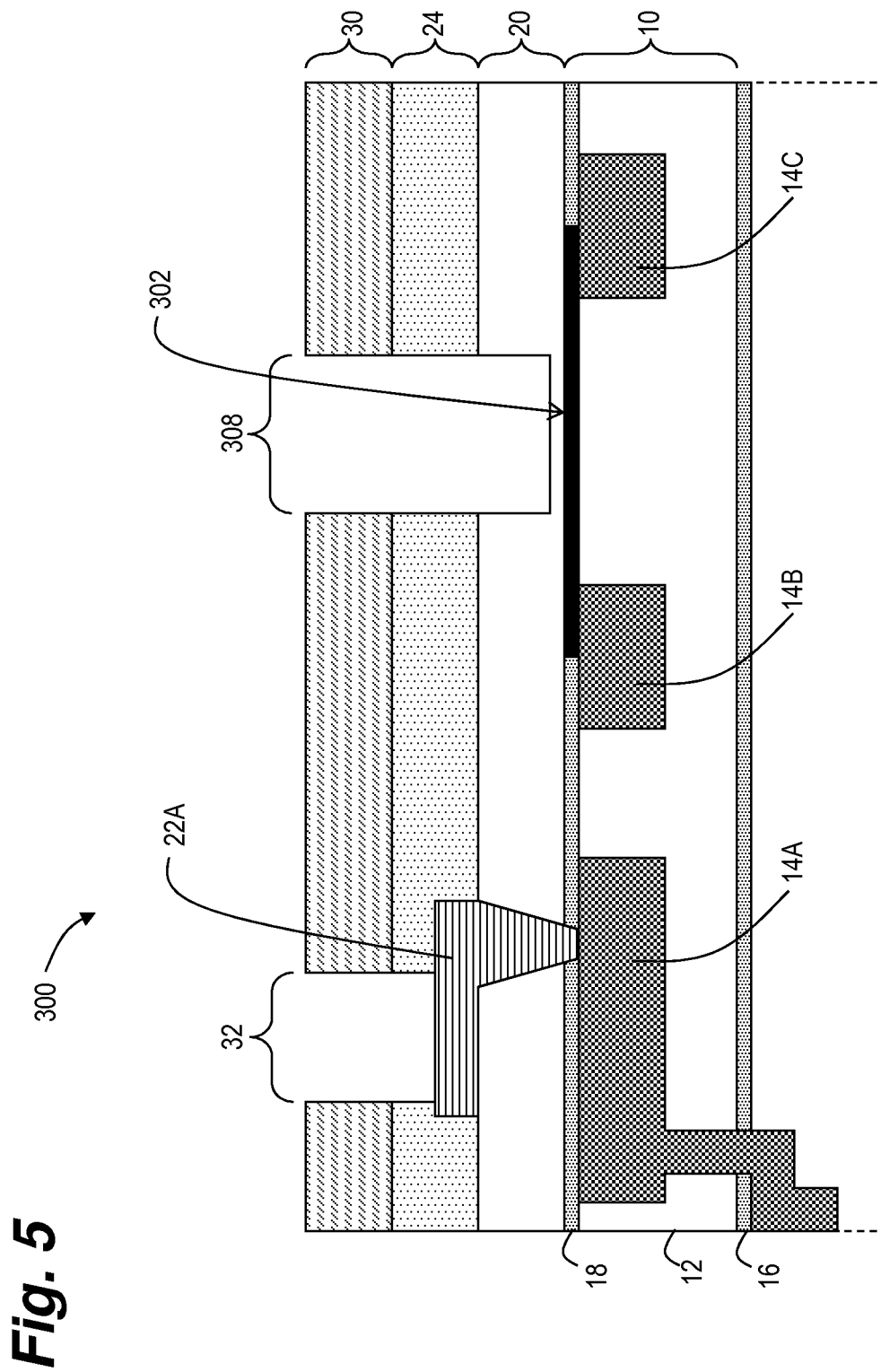
FIG. 5 is a schematic diagram of a third embodiment illustrating a sectional view of yet another aluminum fuse in a semiconductor.

FIG. 5 illustrates a schematic diagram of a third embodiment, constructed in a manner similar to FIGS. 1 and 2. FIG. 5 shows a sectional view of yet another fuse 302 in a semiconductor 300 where the fuse 302 extends from the top surface of the metal conductors 14B and 14C entirely within the upper cap layer 18. The upper cap lay 18 may be a copper diffusion barrier and the fuse 302 may comprise a refractory metal, such as tantalum or tantalum nitride. In this embodiment, the metal conductors 14B and 14C contact the fuse 302 from below the fuse 302, which is a thin wire; for example, having a thickness less than 4 microns to as thin as less than 0.25 microns.

In this third embodiment, a fuse opening 308 extends through the polyamide layer 30, the oxide layer 24, and into the final insulator layer 20 stopping just above the upper surface of the fuse, indicated generally as 302, such that there is a small amount of final insulator layer 20 between the fuse 302 and the fuse opening 308.

In summary, the semiconductor fuse device includes a last metal interconnect layer 10 including at least two discrete metal conductors 14B and 14C, an inter-level dielectric layer, 20, 24 and/or 30 deposited over the last metal interconnect layer 10, and the at least two discrete metal conductors 14B and 14C, an aluminum fuse 102, 202, or 302 connecting the at least two discrete metal conductors 14B and 14C, and a fuse opening 108, 208, or 308 above the aluminum fuse 102, 202, or 302, respectively, and positioned between the at least two discrete metal conductors 14B and 14C.

In a first embodiment, the semiconductor fuse device includes the inter-level dielectric layer comprising the final insulator layer 20 proximate the last metal interconnect layer 10 and oxide 24 and polyimide 30 layers on the final insulator layer 20, the aluminum fuse 102 comprising a central linear fuse portion 106 contacting a lowermost portion of the final insulator layer 20, where the remainder of the central linear fuse portion 106 is positioned entirely within the final insulator layer 20. The aluminum fuse 102 has U-shaped vertical via portions 103 and 104 that connect to the two discrete metal conductors 14B and 14C through the final insulator layer 20 and the oxide 24 and polyimide 30 layers. The fuse opening 108 projects through the final insulator layer 20 and the oxide 24 and polyimide 30 layers.

In a second embodiment, the semiconductor fuse device includes the inter-level dielectric layer comprising the final insulator layer 20 proximate the last metal interconnect layer 10 and oxide 24 and polyimide 30 layers on the final insulator layer 20, the aluminum fuse 202 comprising a central linear fuse 204 portion contacting a lowermost portion of the final insulator layer 20, where the remainder of the central linear fuse portion 204 is positioned within the final insulator layer 20. The aluminum fuse 202 connects the two discrete metal conductors 14B and 14C only through the final insulator layer 20. The fuse opening 206 projects through the oxide 24 and polyimide 30 layers and the final insulator layer 20.

In a third embodiment, the semiconductor fuse device includes the inter-level dielectric layer comprising the final insulator layer 20 proximate the last metal interconnect layer 10 having an upper cap layer 18 and oxide 24 and polyimide 30 layers on the final insulator layer 20, the fuse 302 comprising a thin metal wire. The fuse 302 connects the two discrete metal conductors 14B and 14C entirely within the upper cap layer 18. The fuse opening 308 projects through the oxide 24 and polyimide 30 layers and the final insulator layer 20.

The last metal interconnect layer 10 may include copper conductor structures 14B and 14C, and the fuse opening may be positioned above a portion of the final insulator layer 20 above the aluminum fuse 102, 202, or 302.

Figure 6:
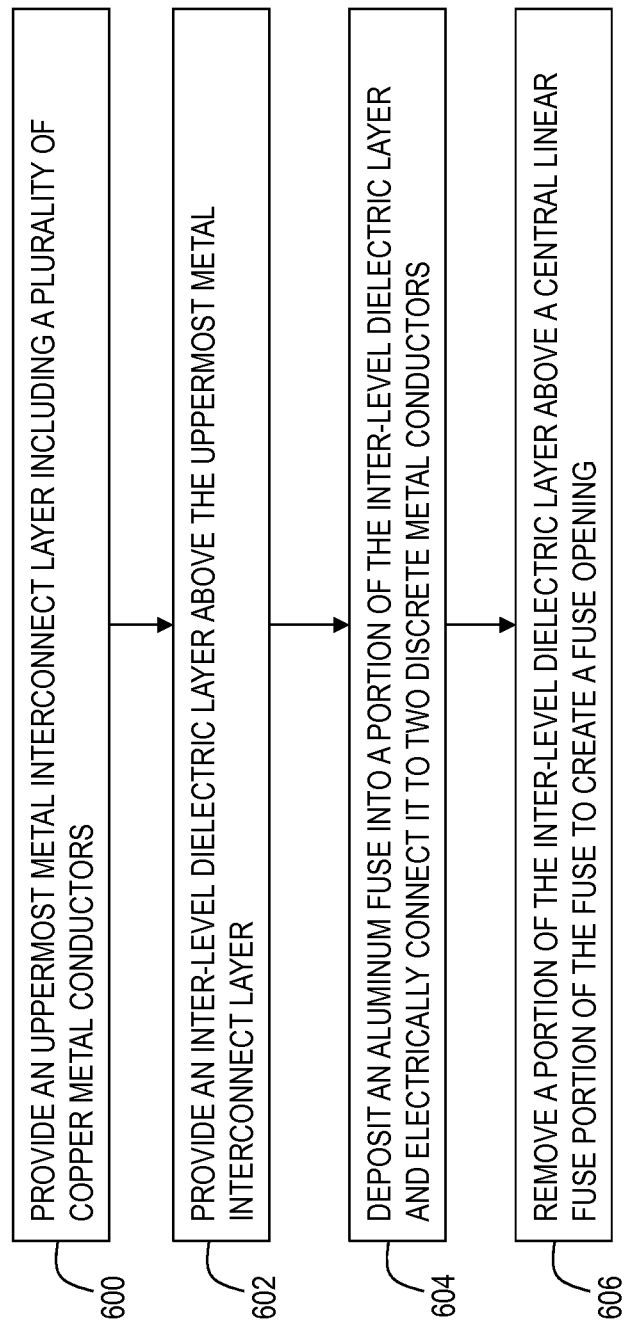
FIG. 6 is a logic flowchart for an embodiment for a method of fabricating an aluminum fuse in a semiconductor.

FIG. 6 illustrates a logic flowchart for an embodiment for a method of fabricating an aluminum fuse in a semiconductor including providing an uppermost metal interconnect layer including a plurality of metal conductors 600. An inter-level dielectric layer is provided above the uppermost metal interconnect layer 602. An aluminum fuse is deposited into a portion of the inter-level dielectric layer and electrically connected to at least two discrete metal conductors with a thin central linear fuse portion 604. A portion of the inter-level dielectric layer is removed above the central linear fuse portion to create a fuse opening 606.

In a first embodiment, the method of fabricating a semiconductor fuse includes providing a final insulator layer proximate the uppermost metal interconnect layer and oxide and nitride layers on the final insulator layer. Depositing the aluminum fuse further includes forming U-shaped vertical via pairs and a central linear fuse portion that contacts a lowermost portion of the final insulator layer, where the remainder of the central linear fuse portion is positioned entirely within the final insulator layer. The fuse opening projects through the oxide and the nitride layers into the final insulator layer.

In a second embodiment, the method of fabricating a semiconductor fuse includes providing a final insulator layer proximate the uppermost metal interconnect layer and oxide and nitride layers on the final insulator layer. Depositing the aluminum fuse further includes forming a central linear fuse portion contacting a lowermost portion of the final insulator layer, where the remainder of the central linear fuse portion is positioned within the final insulator layer. The connection between the aluminum fuse and the discrete metal conductors is formed only through the final insulator layer in this embodiment. The fuse opening projects through the oxide and nitride layers into the final insulator layer.

In a third embodiment, the method of fabricating a semiconductor fuse includes providing a final insulator layer proximate the uppermost metal interconnect layer and oxide and nitride layers on the final insulator layer. Depositing the fuse further includes forming a linear fuse portion entirely within the upper cap layer. The connection between the fuse and the discrete metal conductors is formed directly in this embodiment; the entire fuse is below the final insulator layer. The fuse opening projects through the oxide and nitride layers into the final insulator layer.

The method of fabricating a semiconductor fuse may further include forming copper conductor structures in the last or uppermost conductor layer. The fuse opening may further be positioned above a portion of an oxide layer on the aluminum fuse. The fuse opening may further include contemporaneously removing a second portion of the inter-level dielectric layer above another metal conductor in the uppermost metal interconnect layer to create a bond opening to another metal conductor.

Embodiments described herein teach methods for forming an aluminum fuse in a copper interconnect scheme. Aluminum metallurgy is not susceptible to filament formation under biasing, in the same manner that a copper fuse might be. While aluminum is disclosed as a fuse material in the several embodiments described herein, other appropriate conductive materials for use in a radiation hardened environment, such as tantalum or tantalum nitride, may be used.

With its unique and novel features, the embodiments herein may provide an aluminum fuse for connection to the last metal connect layer of a semiconductor device that enables the un-biasing of the aluminum fuse, and forms a proper fuse filament in a radiation hardened design environment.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of forming a semiconductor device comprising:

forming a metal interconnect layer including at least two discrete metal conductors;

forming a conductive fuse having a first end and a second end connected on said first and second end to said metal conductors;

said fuse further comprising:

a thin linear fuse portion extending between said first end and said second end, forming an inter-level dielectric layer having a first thickness, said inter-level dielectric layer being positioned adjacent said metal interconnect layer, and said inter-level dielectric layer covering said conductive fuse, said fuse being positioned completely within said inter-level dielectric layer, contacting a lowest portion of said inter-level dielectric layer; and forming a fuse recess partially through said inter-level dielectric layer, said fuse recess being formed adjacent said conductive fuse, a thickness of said inter-level dielectric layer between said conductive fuse and said fuse recess being less than said first thickness, said inter-level dielectric layer comprising a bottom layer and at least one other layer, said fuse further comprising:

a U-shaped vertical via on each of said first end and said second end, and said thin linear fuse portion extending between said U-shaped vertical via on said first end and said U-shaped vertical via on said second end, said U-shaped vertical via extending from said end connected to said metal conductor, through said bottom layer and at least partially into said at least one other layer, said linear fuse portion being positioned completely within said bottom layer, and directly contacting a lowest portion of said bottom layer.

2. The method of forming a semiconductor device according to claim 1, a thickness of said linear fuse portion being less than 1 micron.

3. The method of forming a semiconductor device according to claim 1, further comprising forming at least one additional insulator layer adjacent said inter-level dielectric layer, said additional insulator layer comprising an exterior of said semiconductor device, said fuse recess being formed to extend through said additional insulator layer to said exterior of semiconductor device.

4. The method of forming a semiconductor device according to claim 1, said metal conductors comprising copper and said conductive fuse comprising tantalum nitride.

5. The method of forming a semiconductor device according to claim 1, said conductive fuse comprising aluminum.

* * * * *